United States Patent [19]
Takahashi

[11] Patent Number: 5,818,773
[45] Date of Patent: Oct. 6, 1998

[54] SEMICONDUCTOR STORAGE DEVICE

[75] Inventor: Hiroyuki Takahashi, Tokyo, Japan

[73] Assignee: NEC Corporation, Tokyo, Japan

[21] Appl. No.: 919,201

[22] Filed: Aug. 28, 1997

[30] Foreign Application Priority Data

Aug. 29, 1996 [JP] Japan .................................. 8-228732

[51] Int. Cl.$^6$ .................................................. G11C 13/00
[52] U.S. Cl. ...................................... 365/206; 365/230.01
[58] Field of Search ........................ 365/189.01, 230.01, 365/202, 206

[56] References Cited

U.S. PATENT DOCUMENTS 5,010,524  4/1991  Fifiezo et al. ............................ 365/206

OTHER PUBLICATIONS

"A 5ns 32K×8/9 BiMOS TTL SRM with Alternated Bit Line Load Architecture", Technical Report of the Institute of Electronics, Information and Communication Engineers, Sep. 24, 1992.

Primary Examiner—Terrell W. Fears
Attorney, Agent, or Firm—Sughrue, Mion, Zinn, Macpeak & Seas, PLLC

[57] ABSTRACT

The invention provides a semiconductor storage device which reduces noise arising from a coupling capacitance between adjacent digit lines in a memory cell array region having multiple bit input and output terminals. A plurality of first and second digit line selection circuits connect first and second selection digit line pairs to first and second data buses, respectively, such that at least one of non-selected digit line pairs is interposed between a selected digit line pair selected by the first digit line selection circuits and another selected digit line pair selected by the second digit line selection circuits.

6 Claims, 7 Drawing Sheets

SEMICONDUCTOR STORAGE DEVICE

BACKGROUND OF THE INVENTION

1. Field of the Invention

This invention relates to a semiconductor storage device, and more particularly to a semiconductor storage device such as a static random access memory (SRAM).

2. Description of the Related Art

In recent years, an increase of the number of outputs, that is, the number of bits, and a higher frequency operation, that is, a higher speed operation, are demanded for high speed memories in order to allow higher speed transfer of data by a computer system in which such high speed memories are employed. Particularly, since an SRAM is used as a cache memory in a very closely connected relationship to a CPU, the demands are increasing year by year.

In order to satisfy such demands, the number of outputs of an SRAM has exhibited an increase from 1 to 8 of SRAMs in the past to 16 to 32 of SRAMs prevailing at present, and also a further increase to 64 to 128 for future SRAMs is investigated. If those outputs operate at a time at a high speed, then noise on power supply lines makes a significant problem and causes a malfunction at the worst. In order to eliminate this, power supply pins for exclusive use for outputting are provided so that outputs may not be concentrated on one side of a package. For example, where an SRAM has 32 outputs, the 32 outputs are divided into two groups and 16 output pins are arranged on each of two opposing sides of the package of the SRAM. Where this pin arrangement is employed, also the internal layout is preferably adjusted in accordance with the pin arrangement such that the outputs of multiple bits are extracted from two different upper and lower sides. Thus, a column-like layout or alternate bit line arrangement layout wherein signals from digit lines are extracted alternately from the upper and lower sides has been proposed (Report of Technical Investigations of the Institute of Electronics, Information and Communication Engineers of Japan, the Institute of Electronics, Information and Communication Engineers of Japan, Sep. 25, 1992, Vol. 92, No. 242, ICD92-62 TO 73, pp. 57–67) (hereinafter referred to as "document 1").

The semiconductor storage device disclosed in document 1 is shown in FIG. 5. Referring to FIG. 5, the semiconductor storage device shown includes a memory cell MC formed from a flip-flop disposed at each of intersecting points of a matrix of a plurality of word lines WL and a plurality of digit line pairs D and $\overline{D}$ (D01 and $\overline{D01}$, D02 and $\overline{D02}$, . . . ).

Connected to each of the digit line pairs D and $\overline{D}$ are a precharge circuit PC formed from a pair of precharging PMOS transistors for fixing a voltage between the digit line pair D and $\overline{D}$, and a digit line selection circuit YSW formed from a pair of switching transistors for selectively connecting the digit line pair D and $\overline{D}$ to data bus lines DB0 and $\overline{DB0}$ or DB1 and $\overline{DB1}$.

The data bus lines DB0, $\overline{DB0}$ and DB1, $\overline{DB1}$ are connected to input/output terminals I/00 and I/01 via buffer circuits R/W each of which acts, upon reading, as a sensing amplifier but acts, upon writing, as a write buffer.

The digit line selection circuits YSW are arranged alternately on the lower and upper sides for every other digit line pair, and also the data bus lines DB0, $\overline{DB0}$ and DB1, $\overline{DB1}$ are arranged on the lower and upper sides such that they are connected to the digit line selection circuits YSW at lower and upper locations, respectively. Digit selection lines Y1, Y2, . . . for selecting one of the digit line selection circuits YSW with a digit selection signal are located on each of the lower and upper sides.

An example of a construction of a memory cell MC is shown in FIG. 6. Referring to FIG. 6, the memory cell MC shown includes a pair of N-channel MOS (NMOS) transistors MD1 and MD2 of driving transistors each having a gate input and a drain output connected to the drain output and the gate input of the other N-channel MOS transistor MD2 or MD1 so as to form a flip-flop and having resistors R1 and R2 connected as loads thereto, respectively, and a pair of transfer transistors MT1 and MT2 for controlling cell nodes N1 and N2 of the N-channel MOS transistors M1 and MD2 and the digit line pairs D and $\overline{D}$ with a gate signal of a word line WL.

Subsequently, operation of the conventional semiconductor storage device is described with reference to FIGS. 5 and 6. First, in a reading operation, an arbitrary one of the word lines WL is selected, and those memory cells MC connected to the selected word line WL are all turned on so that they individually try to read out data information as potential differences on the respective digit line pairs D and $\overline{D}$. However, one of the digit selection lines Y (Y1, Y2, . . . ) is selected, and on each of the lower and upper sides, only one of the precharge circuits PC is turned off and only a corresponding one of the digit line selection circuits YSW is turned on. A read potential difference is produced between the digit lines of that digit line pair connected to each of the precharge circuits PC which are in the off state, and this read potential is transmitted to the corresponding one data bus lines DB0 and $\overline{DB0}$ or DB1 and $\overline{DB1}$ through the switching transistors of the corresponding digit line selection circuit YSW. The signals of the data bus lines DB0, $\overline{DB0}$ and DB1, $\overline{DB1}$ are individually outputted through the buffer circuits R/W.

On the other hand, in a writing operation, information is transmitted in the reverse paths, and data from the outside are transmitted to and written into only two selected ones of the memory cells MC. The state of the digit lines in a state in which neither reading nor writing is performed therethrough or in a non-selected state is called precharge state in which the digit lines are fixed to a high voltage by the transistors of the precharge circuits PC.

According to the construction of the conventional semiconductor storage device described above, since lead out portions of the digit lines arranged on the upper and lower sides are arranged alternately for every digit pair, peripheral circuits such as the precharge circuits PC and the digit line selection circuits YSW are arranged in a pitch of two digit pairs, and accordingly, the layout is easy to produce. Further, since no signal lines are required from the digit lines to the precharge circuits PC or the digit line selection circuits YSW, the semiconductor storage device is advantageous also in that it can be produced with a comparatively small layout area.

Further, in the conventional semiconductor storage device described above, an electric influence when reading out or writing of data is performed simultaneously on the upper and lower sides is not taken into consideration. In particular, in the conventional circuit and layout constructions described above, every adjacent two digit line pairs make selected digit lines which are simultaneously selected and connected to the upper and lower data buses.

Generally, digit lines are formed by etching of metal wiring lines, and since the width of and the distance between such metal wiring lines are very small, a parasitic capacitance is produced between adjacent digit lines. Where the capacitance (coupling capacitance) in a digital line pair is represented by Cs and the capacitance (line-line capacitance) between adjacent digit lines is represented by Cm, the ratio of the capacitances Cs and Cm occupying in the total capacitance applied to a digit line is increasing to a level which cannot be ignored as refinement of memory cells increases. Consequently, a potential variation of an adjacent wiring line is transmitted as coupling noise by the line-line capacitance Cm between wiring lines. In particular, since the line-line capacitance Cm generally has a similar level to the coupling capacitance Cs of a digit line pair (almost Cs=Cm because generally a one-sided layout is not employed for digit lines), coupling noise arising from the line-line capacitance Cm is so high that it cannot be ignored, and this has an influence when a very low voltage is handled. In particular, also the line-line capacitance Cm acts as a coupling capacitance, and the digit line D11 is influenced by the coupling capacitance of Cs+Cm, and the noise amount is approximately twice that caused only by the capacitance Cs. In short, upon reading, while one of two digit lines of a selected digit line pair holds a high level, not only the other digit line of the selected digit line pair but also a further digit line adjacent this digit line tries to output a low level, and consequently, the influence of coupling noise is doubled and the potential difference between the digit lines of the digit line pair is decreased. Further, since also the potential difference around where the potentials at the digit lines upon recovery from writing become equal to each other is small, it is influenced similarly by coupling noise caused by a large potential variation upon writing operation from an adjacent digit line.

With the conventional semiconductor storage device described above, since an electric influence which occurs when reading or writing of data is performed simultaneously on the upper and lower sides is not taken into consideration and the digit lines are formed from wiring lines which are adjacent each other with very small distances left therebetween, a potential variation of an adjacent digit line is transmitted as coupling noise by a coupling capacitance between wiring lines, and by an influence of the coupling noise, the potential difference between adjacent digit line pairs upon simultaneous reading or writing operation of data on the upper and lower sides is decreased, resulting in malfunction.

SUMMARY OF THE INVENTION

It is an object of the present invention to provide a semiconductor storage device which reduces noise arising from a coupling capacitance between adjacent digit lines in a memory cell array region having multiple bit input and output terminals.

In order to attain the object described above, according to the present invention, there is provided a semiconductor storage device, comprising a memory cell array including a plurality of memory cells arranged at individual intersecting points of a matrix formed from a plurality of word lines and a plurality of digit line pairs each including first and second complementary digit lines, first and second data buses arranged along opposing first and second sides, respectively, of the memory cell array parallel to the word lines, a plurality of first digit line selection circuits individually disposed at first ends of the first digit line pairs for selecting and connecting one of the first digit line pairs as a selected digit line pair to the first data bus but supplying a precharge voltage to the remaining non-selected ones of the first digit line pairs, a plurality of second digit line selection circuits individually disposed at second ends of the second digit line pairs remote from the first ends of the first digit line pairs for selecting and connecting one of the second digit line pairs as a selected digit line pair to the second data bus but supplying a precharge voltage to the remaining non-selected ones of the second digit line pairs, and first and second input/output buffer circuits connected to the first and second data buses, respectively, for functioning as sensing amplifiers when a reading operation from the semiconductor storage device is performed but functioning as write buffers when a writing operation into the semiconductor storage device is performed, the first and second digit line selection circuits connecting the first and second selection digit line pairs to the first and second data buses, respectively, such that at least one of the non-selected digit line pairs is interposed between the selected digit line pair selected by the first digit line selection circuits and the selected digit line pair selected by the second digit line selection circuits.

Where the first digit line pairs and the second digit line pairs are arranged alternately for each at least two digit line pairs, even if the orders of selection of the first digit line selection circuits and the second digit line selection circuits are same, a non-selected digit line pair can be interposed between the selected digit line pairs selected by the first and second digit line selection circuits.

Where the first digit line pairs and the second digit line pairs are arranged alternately, the first digit line selection circuits and the second digit line selection circuits may select in orders displaced from each other such that at least one of the non-selected digit line pairs may be interposed between the selected digit line pair selected by the first digit line selection circuits and the selected digit line pair selected by the second digit line selection circuits. Or, similarly where the first digit line pairs and the second digit line pairs are arranged alternately, a power supply line may be interposed between the selected digit line pair selected by the first digit line selection circuits and the selected digit line pair selected by the second digit line selection circuits where the selected digit line pairs are adjacent each other.

The memory cells may be static memory circuits each formed from a flip-flop.

In the semiconductor storage device described above, since a non-selected digit line pair or a power supply line is interposed between a pair of selected digit line pairs so that the digit line pairs selected simultaneously may not be adjacent each other, coupling noise arising from a capacitance between digit lines can be suppressed. Consequently, possible factors of reduction of the read voltage margin or delay of the write recovery time can be eliminated.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
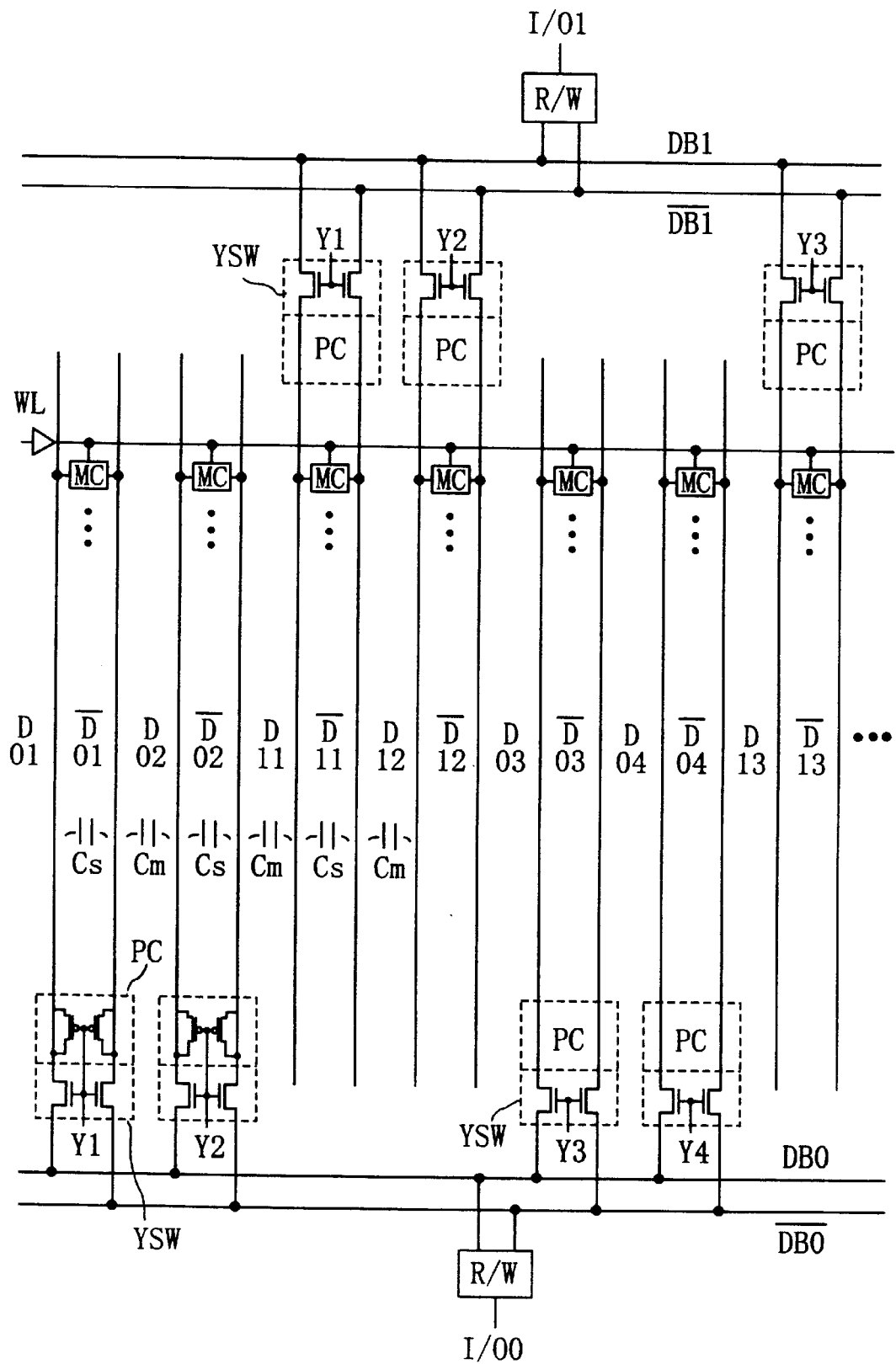
FIG. 1 is a block diagram of a semiconductor storage device showing an embodiment of the present invention.
Figure 5:
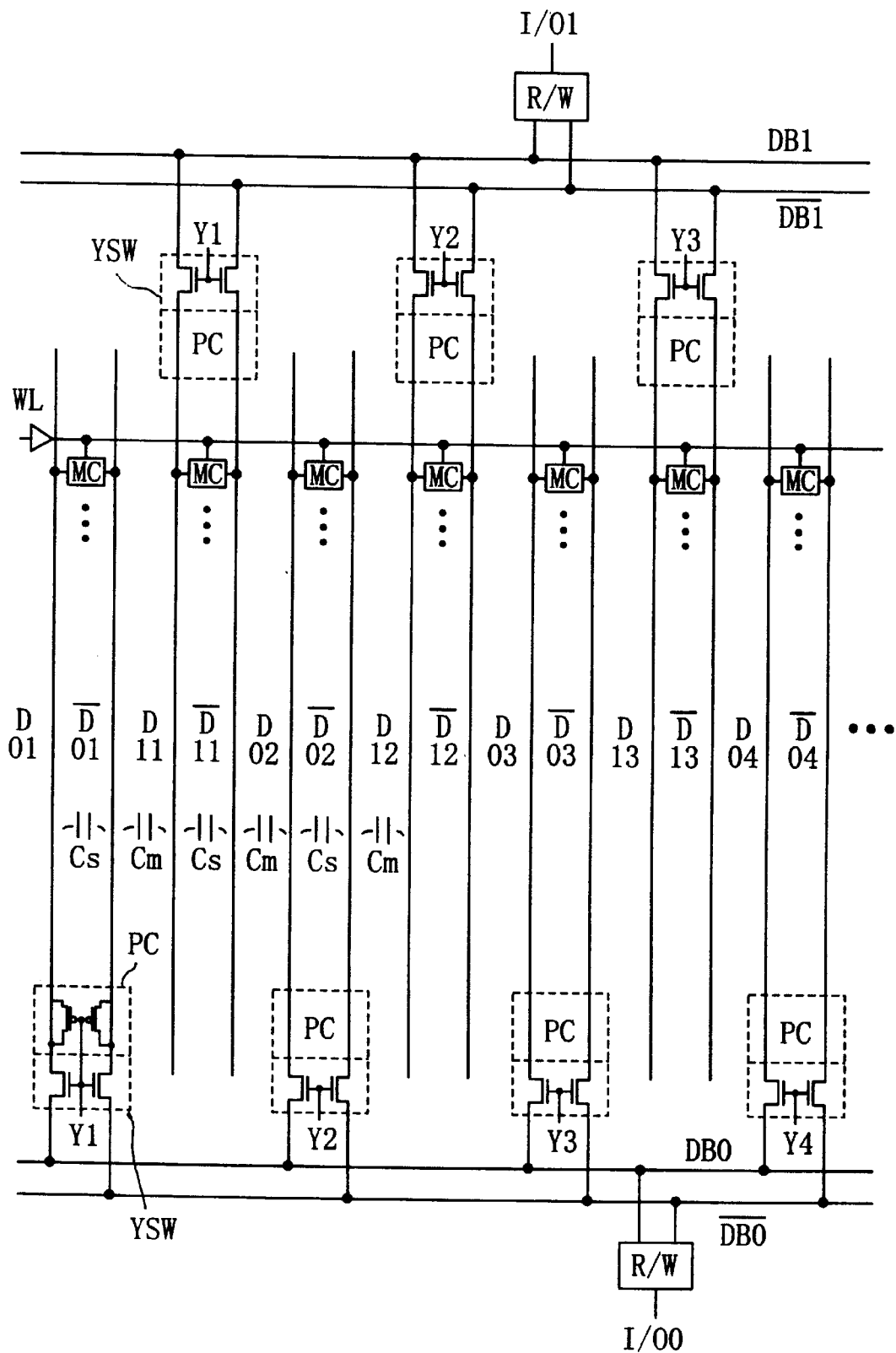
FIG. 5 is a block diagram showing an exemplary one of conventional semiconductor storage devices.

Referring first to FIG. 1, there is shown a semiconductor storage device to which the present invention is applied. The semiconductor storage device is formed as an improved device of the conventional storage device described hereinabove with reference to FIGS. 5 and 6 and as an SRAM of multiple bit outputs having output pins arranged at upper and lower locations, and in FIG. 1, circuit and layout constructions of the semiconductor storage device for extracting one output bit on each of the upper and lower sides are shown.

Figure 6:
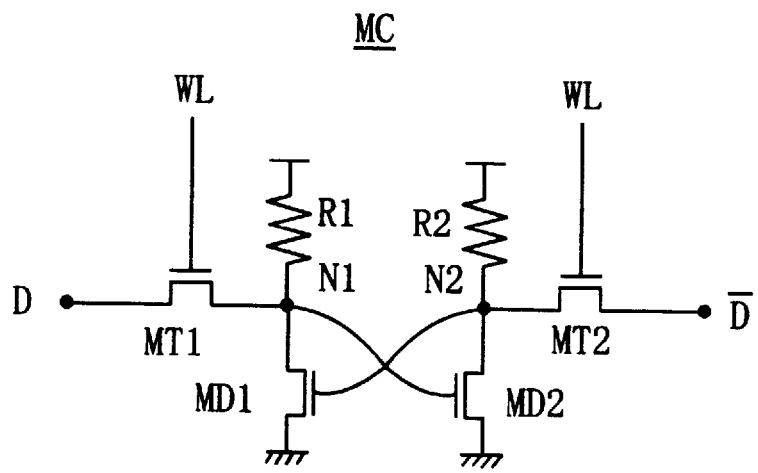
FIG. 6 is a circuit diagram showing a circuit construction of a representative memory cell of the conventional semiconductor storage device of FIG. 5.

The semiconductor storage device includes a memory cell MC in the form of such a static memory circuit formed from a flip-flop as shown in FIG. 6. The memory cell MC is disposed at each of intersecting points of a matrix of a plurality of word lines WL and a plurality of digit line pairs D and $\overline{D}$ (D01 and $\overline{D01}$, D02 and $\overline{D02}$, . . . ), and a precharge circuit PC for fixing a voltage of a digit line pair and a digit line selection circuit YSW for selectively connecting a digit line pair to data bus lines DB0 and $\overline{DB0}$ or DB1 and $\overline{DB1}$ are connected to each digit line pairs D and $\overline{D}$.

The data bus lines DB0 and $\overline{DB0}$ or DB1 and $\overline{D01}$ are connected to an input/output terminal I/0 (I/00 or I/01) via a buffer circuit R/W.

In the semiconductor storage device, the digit line selection circuits YSW are arranged in the following manner. In particular, the digit line selection circuits YSW are arranged alternately on the upper and lower sides for every two digit line pairs, and also the data bus lines DB0, $\overline{DB0}$ and DB1, $\overline{DB1}$ are arranged on the lower and upper sides such that they are connected to the digit line selection circuits YSW on the lower and upper sides, respectively. Also digit selection lines Y (Y1, Y2, . . . ) for selecting one of digit line selection circuits YSW with a digit selection signal are located on each of the lower and upper sides. The digit selection lines Y1, Y2, Y3, . . . are successively selected from the left toward the right in FIG. 1, that is, in order of Y1, Y2, Y3, . . . , on both of the upper and lower sides.

Subsequently, operation of the semiconductor storage device is described with reference to FIG. 1. First, in a reading operation, an arbitrary line of the word lines WL is selected, and in response to the selection, all of the memory cells MC connected to the selected word line WL are turned on and try to read out data information thereof as potential differences on the respective digit line pairs D and $\overline{D}$. However, in response to supply of a digit selection signal, only one of the precharge circuits PC on each of the upper and lower sides is selectively turned off so that the corresponding digit line selection circuit YSW is turned on. In response to the turning off of each of the two selected precharge circuits PC, a read potential difference appears on the corresponding digit line pair, and the corresponding digit line selection circuit YSW transmits the potential difference through the switching transistors thereof to the data bus lines DB0 and $\overline{DB0}$ or DB1 and $\overline{DB1}$. The signals on the data bus lines DB0, $\overline{DB0}$ and DB1, $\overline{DB1}$ are outputted through the corresponding buffer circuits R/W.

In a writing operation, information is transmitted in the reverse paths, and data from the outside are transmitted to and written into only two selected ones of the memory cells MC. Those digit lines for which neither reading nor writing is performed, that is, which are not selected, are fixed to the highest potential VCC since the precharge transistors of the precharge circuits PC are on. In order to select digit line selection circuits YSW, if, for example, the digit selection lines Y1 are selected, then the first digit line pair D01 and $\overline{D01}$ is selected so as to be connected to the input/output terminal I/00 on the lower side while the third digit line pair D11 and $\overline{D11}$ is selected so as to be connected to the input/output terminal I/01 on the upper side. In this instance, the second digit line pair D02 and $\overline{D02}$ positioned between the first digit line pair D01 and $\overline{D01}$ and the third digit line pair D03 and $\overline{D03}$ remains in a non-selected state.

Figure 2A:
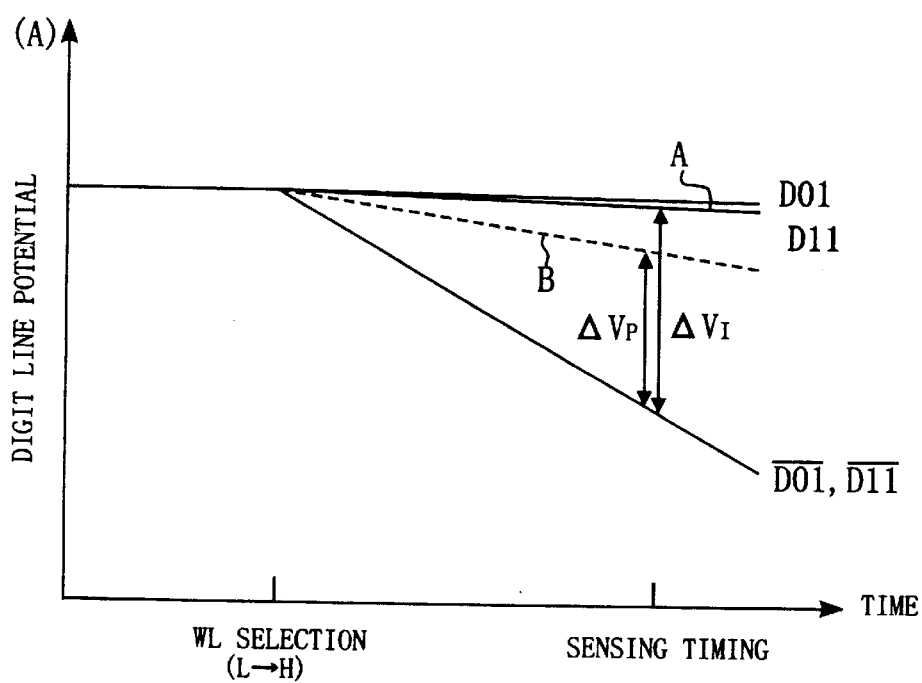
FIGS. 2(A) and 2(B) are characteristic diagrams illustrating read/write operation characteristics of the semiconductor storage device of FIG. 1 together with those of a conventional semiconductor storage device.

Subsequently, operation characteristics of the semiconductor storage device of the present embodiment are described with reference to FIGS. 2(A) and 2(B) which illustrate waveforms in writing and reading operations of the device. First, FIG. 2(A) illustrates variations of the potentials appearing at digit lines upon starting of reading. Referring to FIG. 2(A), after a word line WL is turned on, the digit line D of a digital line pair tries to maintain the high level while the potential at the digit line $\overline{D}$ drops and gradually approaches the low level, and soon, a reading timing of a sense amplifier (not shown) comes. Although the variation in potential at the digit line D01 exhibits no difference between the conventional circuit (graph B) and the circuit of the present embodiment (graph A), the variation in potential at the digit line D11 exhibits a significant drop of the H level with the conventional circuit, and the potential differences at the reading timing of the sense amplifier exhibit a relationship of $\Delta VI > \Delta Vp$. In other words, the circuit of the present embodiment provides a larger read potential difference than the conventional circuit, and consequently, an increase of the voltage margin and higher speed operation are facilitated.

This difference arises from a difference of a digit line adjacent the digit line D11. In particular, the adjacent digit line to the digit line D11 in the conventional circuit is the selected digit line $\overline{D01}$ and besides exhibits a drop in potential so as to come to the L level. In contrast, the adjacent digit line to the digit line D11 in the circuit of the present embodiment is the digit line D02 which remains in a non-selected state and has a voltage fixed to the maximum voltage VCC.

As described in the description of the related art above, a parasitic capacitance is produced between adjacent digit lines. Here, where the coupling capacitance between lines of a digit line pair is represented by Cs and the capacitance between adjacent digit lines is represented by Cm and it is assumed that Cs=Cm, the digit line D11 in the conventional circuit is influenced by a total coupling capacitance of Cs+Cm, and the noise amount is approximately twice that of the circuit of the present embodiment wherein the total coupling capacitance is provided only by the capacitance Cs.

Figure 2B:
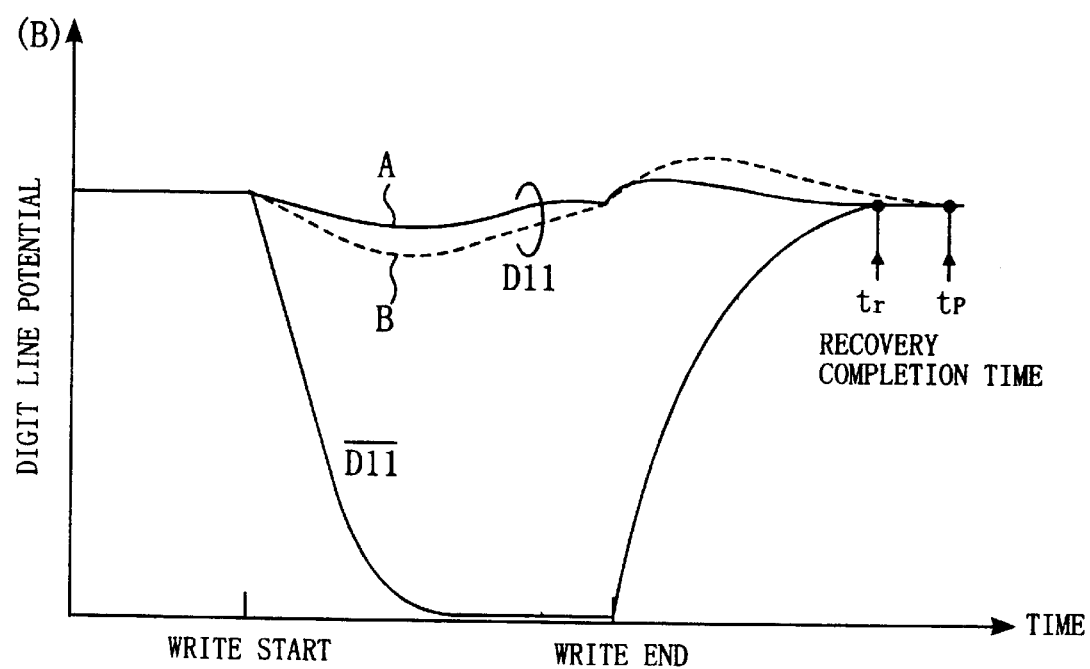

FIG. 2(B) illustrates variations of potentials of digit lines upon writing operation and recovery. Referring to FIG. 2(B), upon writing by noticed digit lines D11 and $\overline{D11}$, the potential of the digit line $\overline{D11}$ is lowered to a level near to the lowest potential GND to write the low level to a memory cell MC, and after completion of the writing, the potential of the digit line $\overline{D11}$ is raised to a high potential near to the highest potential VCC to suppress the potential difference between the digit line $\overline{D11}$ and the digit line D11 to zero, thereby completing the recovery operation. Upon such writing, since the digit line $\overline{D11}$ undergoes a potential variation equal to a power supply voltage, also the influence of coupling noise arising from the capacitances Cs and Cm is significant. The digit line D11 of the high level is influenced in the level dropping direction upon starting of writing, but is influenced in the level raising direction upon completion of writing. The level drop of the digit line D11 during writing does not matter very much if the precharge voltage is sufficiently high (where the potential of the digit line is set to an intermediate potential between the highest potential VCC and the lowest potential GND, if the level drop is large, the potential at the high node of the memory cell is dropped thereby to reduce the operation voltage margin of the cell). Upon writing recovery, since a very low voltage in the proximity of 0 V is handled as a digit line potential difference, the influence of the noise cannot be ignored. Since the noise is produced in the direction in which it acts to increase the potential difference, the recovery completion time tp of the conventional circuit becomes longer than the recovery type tI of the circuit of the present embodiment and is tI<tp.

While description is given above of selection of the digit selection lines Y1, also when the digit selection lines Y2 are selected, the non-selected digit lines D11 and $\overline{D11}$ are positioned between the selected digit lines D02, $\overline{D02}$ and D12, $\overline{D12}$, and in selection of the digit selection lines Y3 and so forth, similar sequences as with the digit selection lines Y1 and Y2 are performed repetitively. Accordingly, non-selected digit lines in a precharge state are always interposed between a selected digit line pair and another selected digit line pair, and the digit lines in a precharge state shield the selected digit lines from coupling noise. Consequently, reduction of the voltage margin or deterioration in characteristic by noise can be suppressed to the minimum.

Thanks to the progress in fine working, the area of a memory cell is decreasing year by year, and the ratio of the wiring line height to the wiring line width of a digit line tends to increase in order to suppress an increase of the time constant. In particular, the rate of the coupling capacitance from an adjacent digit line is in an increasing tendency, and also the influence of noise arising from such coupling capacity increases. Accordingly, a demand for coupling noise reduction circuit and layout constructions is estimated to become more significant in future.

It is to be noted that, in order to achieve a similar effect, also another construction wherein the digit line selection circuits YSW are arranged alternately on the upper and lower sides for every three digit line pairs can naturally be selected in accordance with the necessity.

Figure 3:
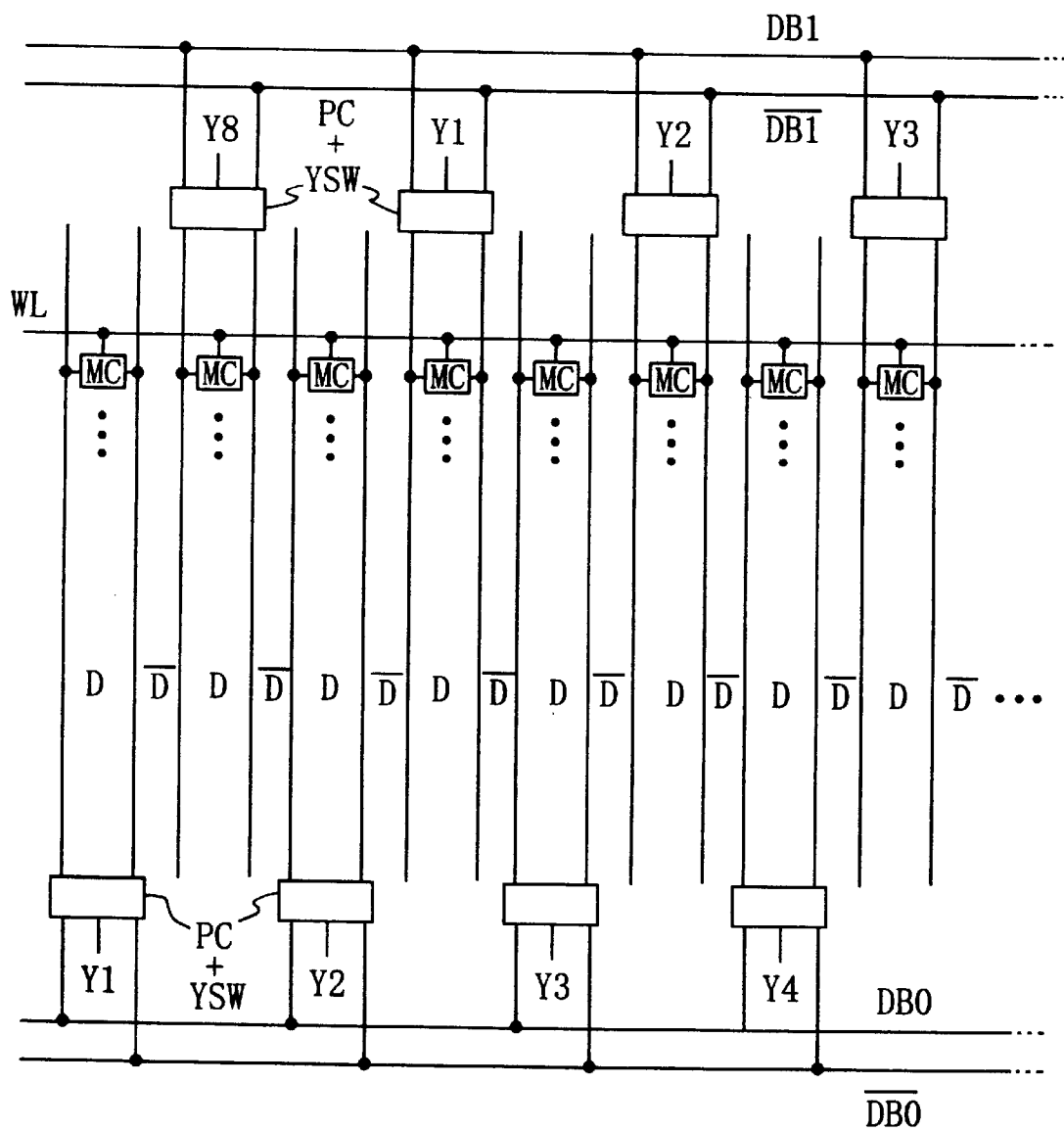
FIGS. 3 and 4 are block diagrams of semiconductor storage devices showing different embodiments of the present invention.

Referring now to FIG. 3, there is shown another semiconductor storage device to which the present invention is applied. The semiconductor storage device of the present embodiment is a modification to and different from the semiconductor storage device of the first embodiment principally in that, as an alternate upper and lower side extraction layout for each digit line pair, digit line selection circuits YSW are arranged alternately on the upper and lower sides for each one digit line pair and the order in selection of addresses of the digit selection lines Y is displaced between the upper and lower sides so that adjacent digit lines may not be selected by upper and lower input/output terminals I/00 and I/00.

By the arrangement, an increase in layout area arising from the alternate upper and lower side extraction for every two digit line pairs in the semiconductor storage device of the first embodiment is canceled. In the semiconductor storage device of the first embodiment, a sequence wherein two digit line pairs are led out successively and followed by a space which corresponds to two digit line pairs but includes no extraction digit line pair repetitively appears on one side of the memory cell array, and consequently, in layout arrangement of peripheral circuits, a surplus space is required for wiring lines from the digit lines and an increase of the area for the space makes a drawback of the semiconductor storage device. In order to eliminate this drawback, in the semiconductor storage device of the present embodiment, the digit lines are extracted alternately on the upper and lower sides for each digit line pair. However, the order of selection of addresses of digit selection lines Y is displaced between the upper and lower sides so that adjacent digit lines may not be selected by the input/output terminals I/01 and I/00 on the upper and lower sides.

For convenience of description, it is assumed that the number of decoders for the digit selection lines Y is 8. In this instance, the digit selection signals are applied such that the digit selection lines Y1, Y2, Y3, . . . , Y7 and Y8 are successively selected at the input/output terminal I/00 on the lower side but the digit selection lines Y8, Y1, Y2, . . . , Y6 and Y7 are successively selected at the input/output terminal I/01 on the upper side. In other words, the digit selection line Y8 which originally is at the last address is shifted to a position prior to the digit selection line Y1 which originally is at the first address, and thereafter, selection is performed in the prescribed order. When the digit selection lines Y1 are selected, a digit line pair corresponding to that one of the digit selection lines Y2 which is extracted on the lower side and another digit line pair corresponding to the other one of the digit selection lines Y2 which is extracted on the upper side are interposed in a non-selected state between the selected digit line pairs, and the thus interposed digit line pairs exhibit a shield effect against coupling noise. As a result of the shifting between the digit selection signals on the upper and lower sides, two non-selected digit line pairs are interposed between selected digit line pairs. This displacement between the orders of the digit selection signals on the upper and lower sides can be performed merely by modifying the order of extraction of decode signals from the address input and can be realized without any increase of the layout area.

It is to be noted that, in order to achieve a similar effect, displacement between the orders of the digit selection signals by a two or more address number may naturally be selected in accordance with the necessity.

Figure 4:
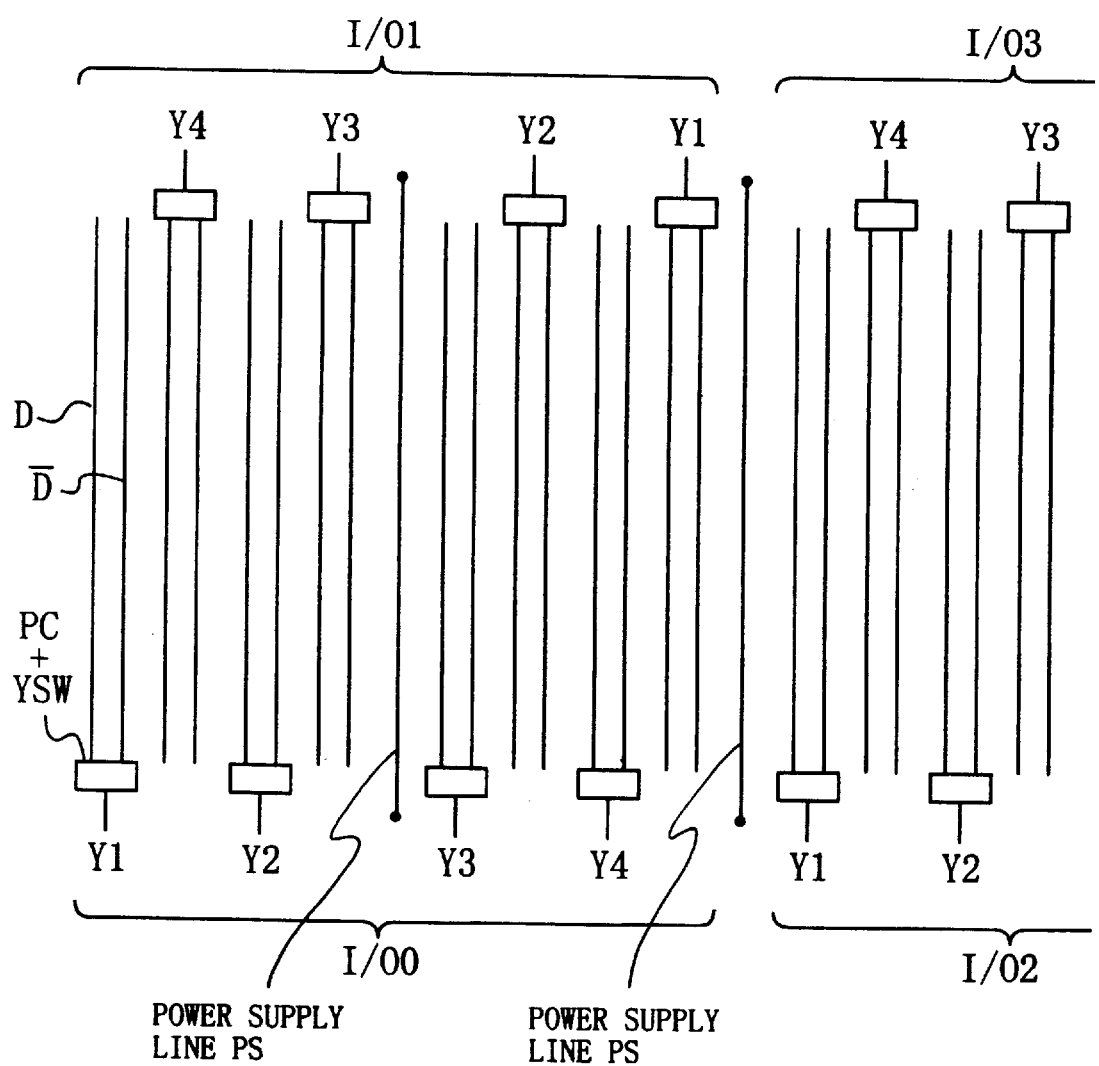

Referring now to FIG. 4, there is shown a further semiconductor storage device to which the present invention is applied. The semiconductor storage device of the present embodiment is a modification to and different from the semiconductor storage device of the second embodiment in that the digit selection signals are applied such that digit selection lines are successively selected from the left side on the lower side but are successively selected from the right side on the upper side and a power supply line PS is interposed between adjacent digit lines which are selected when adjacent digit lines are selected for input/output terminals I/01 and I/00 on the upper and lower sides.

By the construction described above, difficulty in formation of the upper and lower blocks in a layout design which arises from the fact that the order of the digital selection signals in the semiconductor storage device of the second embodiment is displaced between the peripheral circuits on the upper and lower sides i s eliminated. In short, while the layouts on the upper and lower sides are preferably formed only by copying or reversing processing as much as possible, for the shifting of the digit selection signals, connections of the decode signals are produced separately for the upper and lower sides.

In order to eliminate this drawback, the digit selection lines are successively selected from the left on the lower side but from the right on the upper side. However, in several cases of selection, adjacent digit lines are selected at the input/output terminals I/01 and I/00 on the upper and lower sides. Between the adjacent digit lines selected in those cases, the power supply lines PS are interposed individually.

For convenience of description, it is assumed that the number of decoders for the digit selection lines Y is 4. Extraction to the input/output terminal I/00 is performed for each one digit selection line in order of Y1, Y2, Y3 and Y4, and also extraction to the input/output terminal I/01 is performed for each one digit selection line, but in order of Y4, Y3, Y2 and Y1. In this instance, when the digit selection lines Y3 are selected, since this signifies that adjacent digit lines are selected in this instance, a power supply line PS is interposed between the digit line pairs. As a similar case, where blocks of a further input/output terminal I/02 and a still further input/output terminal I/03 are similarly formed adjacent the input/output terminal I/00 and the input/output terminal I/01, respectively, when the digit selection lines Y1 are selected, adjacent digit lines are selected at the input/output terminal I/01 and the input/output terminal I/02. Accordingly, a power supply line PS must be interposed also between the adjacent digit line pairs. If GND wiring lines for memory cells which are conventionally used are utilized for those power supply lines PS, then particular power supply lines only for the shielding function need not be additionally provided, and consequently, the area of the memory cell array region is not increased.

Having now fully described the invention, it will be apparent to one of ordinary skill in the art that many changes and modifications can be made thereto without departing from the spirit and scope of the invention as set forth herein.

What is claimed is:

1. A semiconductor storage device, comprising:
   a memory cell array including a plurality of memory cells arranged at individual intersecting points of a matrix formed from a plurality of word lines and a plurality of digit line pairs each including first and second complementary digit lines;
   first and second data buses arranged along opposing first and second sides, respectively, of said memory cell array parallel to said word lines;
   a plurality of first digit line selection circuits individually disposed at first ends of said first digit line pairs for selecting and connecting one of said first digit line pairs as a selected digit line pair to said first data bus but supplying a precharge voltage to the remaining non-selected ones of said first digit line pairs;
   a plurality of second digit line selection circuits individually disposed at second ends of said second digit line pairs remote from the first ends of said first digit line pairs for selecting and connecting one of said second digit line pairs as a selected digit line pair to said second data bus but supplying a precharge voltage to the remaining non-selected ones of said second digit line pairs; and
   first and second input/output buffer circuits connected to said first and second data buses, respectively, for functioning as sensing amplifiers when a reading operation from said semiconductor storage device is performed but functioning as write buffers when a writing operation into said semiconductor storage device is performed;
   said first and second digit line selection circuits connecting said first and second selection digit line pairs to said first and second data buses, respectively, such that at least one of the non-selected digit line pairs is interposed between the selected digit line pair selected by said first digit line selection circuits and the selected digit line pair selected by said second digit line selection circuits.

2. A semiconductor storage device as claimed in claim 1, wherein said first digit line pairs and said second digit line pairs are arranged alternately for each at least two digit line pairs.

3. A semiconductor storage device as claimed in claim 1, wherein said first digit line pairs and said second digit line pairs are arranged alternately, and said first digit line selection circuits and said second digit line selection circuits select in orders displaced from each other such that at least one of the non-selected digit line pairs may be interposed between the selected digit line pair selected by said first digit line selection circuits and the selected digit line pair selected by said second digit line selection circuits.

4. A semiconductor storage device as claimed in claim 1, wherein said memory cells are static memory circuits each formed from a flip-flop.

5. A semiconductor storage device, comprising:
   a memory cell array including a plurality of memory cells arranged at individual intersecting points of a matrix formed from a plurality of word lines and a plurality of digit line pairs each including first and second complementary digit lines;
   first and second data buses arranged along opposing first and second sides, respectively, of said memory cell array parallel to said word lines;
   a plurality of first digit line selection circuits individually disposed at first ends of said first digit line pairs for selecting and connecting one of said first digit line pairs as a selected digit line pair to said first data bus but supplying a precharge voltage to the remaining non-selected ones of said first digit line pairs;
   a plurality of second digit line selection circuits individually disposed at second ends of said second digit line pairs remote from the first ends of said first digit line pairs for selecting and connecting one of said second digit line pairs as a selected digit line pair to said second data bus but supplying a precharge voltage to the remaining non-selected ones of said second digit line pairs;
   said first digit line pairs and said second digit line pairs being arranged alternately; and
   a power supply line interposed between the selected digit line pair selected by said first digit line selection circuits and the selected digit line pair selected by said second digit line selection circuits where the selected digit line pairs are adjacent each other.

6. A semiconductor storage device as claimed in claim 5, wherein said memory cells are static memory circuits each formed from a flip-flop.

* * * * *